United States Patent [19]

Carlson

[11] Patent Number: 4,923,031

[45] Date of Patent: May 8, 1990

[54] HIGH OUTPUT LOUDSPEAKER SYSTEM

[75] Inventor: David E. Carlson, Niles, Mich.

[73] Assignee: Electro-Voice, Incorporated, Buchanan, Mich.

[21] Appl. No.: 833,859

[22] Filed: Feb. 26, 1986

[51] Int. Cl.[5] .............................................. H05K 5/00

[52] U.S. Cl. .................................... 181/144; 181/145; 181/147; 181/150; 181/152; 181/155; 181/156; 181/199

[58] Field of Search ............... 181/144, 145, 150, 152, 181/155, 159, 147, 179, 182, 189, 190, 156

[56] References Cited

U.S. PATENT DOCUMENTS

| | | | |
|---|---|---|---|
| 3,898,384 | 8/1975 | Goeckel | 181/152 X |
| 4,215,761 | 8/1980 | Andrews | 181/152 |
| 4,437,540 | 3/1984 | Murakami et al. | 181/152 X |
| 4,629,029 | 12/1986 | Gunness | 181/199 X |

*Primary Examiner*—Benjamin R. Fuller
*Attorney, Agent, or Firm*—Burmeister, York, Palmatier, Hamby & Jones

[57] ABSTRACT

A loudspeaker with a pair of speaker units and a manifold chamber between the speaker units for combining the sound from both speaker units. The manifold chamber is formed by walls having an exit opening and a pair of rectangular apertures, the apertures confronting each other on opposite sides of the chamber and the exit opening being disposed normal to a plane centrally between the apertures, and the apertures and exit opening having parallel axes of elongation. One of the speaker units is coupled to each of the apertures to direct sound into the manifold chamber, and the manifold chamber is provided with a wedge confronting the apertures to direct sound parallel to the central plane between the apertures toward the exit opening. In one construction, a horn is coupled to the exit opening to conduct sound from the manifold chamber. Also in that construction, each of the speaker units has a vibratile cone confronting the apertures to which it is coupled and the cone is disposed in an enclosure provided with a bass reflex port.

In another construction, four speaker units with vibratile cones are coupled to four apertures in walls forming a single manifold chamber with a single exit opening.

In still another construction, a compression driver is coupled to each of the apertures through a transition section of the driver.

9 Claims, 2 Drawing Sheets

HIGH OUTPUT LOUDSPEAKER SYSTEM

BACKGROUND OF THE INVENTION a. Field of the Invention

This invention relates to an arrangement of speaker units for mid-bass, mid-range and high frequency sound reproduction systems, particularly adapted for high power output. More particularly, the invention is directed to a manifold for coupling multiple loudspeaker units, to derive high power output with desirable characteristics in the mid-bass, mid-range and high frequency regions.

b. Description of the Prior Art

Multiple loudspeakers are often used in sound applications requiring high acoustic power output (sound volume) such as theaters or arenas or for studio and stage monitoring, discotheques and the like. In many sound systems several components, such as driver/horn assemblies or cone/enclosure loudspeakers, are used for sound reproduction across the entire range of audible sound, with different devices covering the bass or low frequency range (up to 200 hertz), mid-bass and mid-range (200–2000 hertz), and high frequency (above 2000 hertz) portions of the sound spectrum.

For loud sounds or high volume it is necessary to set a large volume of air in motion to create high acoustic power. In order to move larger air volumes, the excursion of a moving diaphragm having a given cone area could be increased, but once the linear limitation of the loudspeaker suspension is reached acoustic distortion increases with increasing excursion, so that this solution to attaining high sound volume is not as desirable as using multiple loudspeakers.

Multiple loudspeakers are conventionally mounted on a front baffle board of a speaker housing or enclosure. The housing may be closed or may be provided with one or more phase-inverting ports or ducts, as in a bass-reflex type enclosure. Acoustic coupling and wave addition occurs in such structures at frequencies where the wavelengths are sufficiently greater than the distances between the individual speakers or the phase-inverting ports. However, for frequencies where the wavelengths are shorter, the use of multiple speakers may cause aberrations in the uniformity of response in various directions, due to the interference between the sound waves from the different speakers, which can cause gaps or "holes" in the frequency characteristic for particular directions toward which the sound is to be projected. U.S. Pat. Nos. 4,391,346 and 4,437,540 issued to Murikami et al. respectively on July 5, 1983, and Mar. 20, 1984, show one approach to combining the outputs of several cone-type speakers. The individual speaker units are set in the walls of a cavity behind a front baffle board or panel. The speaker units of Murikami et al. are arranged so that the sound-radiating axes of the speaker units angularly converge forward and are concentrated on a point of the central axis of the cavity just behind a front baffle panel toward which the speakers are generally aimed. Such an arrangement adversely affects sound reproduction in the mid-bass/-mid-range covering approximately 200 hertz to 2,000 hertz, because at frequencies at which the wavelength is less than the spacing between the speaker units, the outputs of the individual units will not completely add, because of phase differences due to path length differences.

Another arrangement highly suitable for bass or woofer speakers is shown in copending application of R. J. Newman and D. E. Carlson, Ser. No. 834,403 entitled "High Output Loudspeaker for Low Frequency Reproduction", filed Feb. 26, 1986 assigned to the same assignee as the present application. However, this other arrangement is suitable mostly for the very low frequency range, and is not sufficiently effective in the mid-bass/mid-range.

The present invention is directed toward a solution for these drawbacks by providing a novel and unique loudspeaker manifolding system, particularly useful for mid-bass/mid-range frequencies using cone-type loudspeakers and for high frequencies using compression drivers.

SUMMARY OF THE INVENTION

An object of the invention is to provide an improved speaker system for high volume sound. A more specific object is to provide an efficient arrangement for summing the outputs of a number of individual speaker units while minimizing destructive sound interference between the speakers in the mid-bass, mid-range and high frequencies, and at the same time maximizing the output.

According to an embodiment of the invention, a loudspeaker enclosure having a special manifold chamber is provided. The manifold chamber provides a way of combining the outputs of a plurality of individual speaker units, so as to cause their sound outputs to be additive without destructive interference at the frequency range of interest, and without being restricted by the speaker spacing.

BRIEF DESCRIPTION OF THE DRAWINGS

Other objects, features and advantages of the invention will be more clearly understood when taken together with the detailed description below and the accompanying drawings in which.

DETAILED DESCRIPTION OF PREFERRED EMBODIMENTS

Referring to the figures, different embodiments of a speaker manifold system according to the present invention are illustrated. In each instance the manifold is provided in a sealed enclosure or box commonly referred to as an infinite baffle or closed box enclosure, although other enclosures such as a vented or ported box commonly referred to as a bass-reflex type enclosure, can be used.

In each embodiment it will be seen that at least one pair of speaker units is mounted in alignment on opposed walls of a manifold chamber so that the axial radiating directions of the speaker units are aimed either directly at or away from each other, and perpendicularly to the forward radiating direction of the enclosure. Between the speakers is a sound reflecting structure which reflects the sound impinging thereon to change its direction by 90 degrees.

Figure 1:
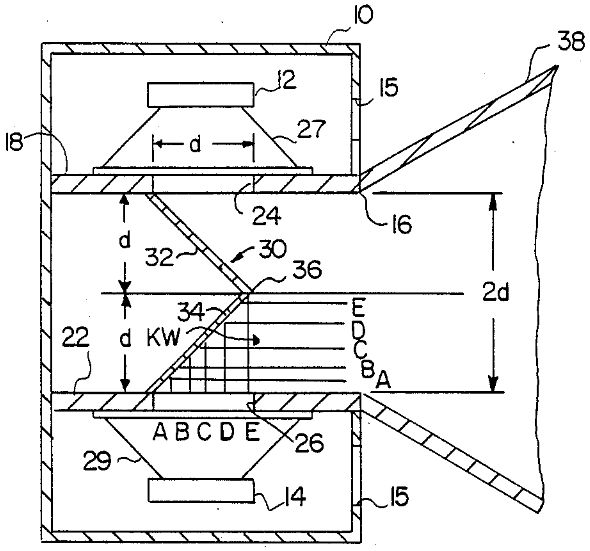
FIG. 1 is a schematic plan view partly in section of a system for manifolding two cone-type speakers according to the invention.
Figure 2:
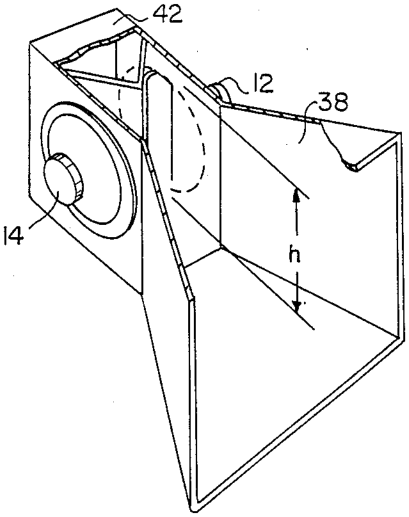
FIG. 2 is a perspective and schematic view of a portion of the system in FIG. 1.

Referring to FIG. 1, within the enclosure 10 are a pair of oppositely directed speaker units 12 and 14 with their axes aligned. Speaker units 12 and 14 are illustrated as being any conventional diaphragm or cone-type speakers, although, as described below, they may take the form of various driver units. Enclosure 10 has an aperture or manifold exit opening 16 in one wall thereof and may be otherwise completely enclosed, except for conventional bass reflex ports 15 which may be included in some embodiments.

Within enclosure 10 are a pair of panels or baffles 18 and 22 which support the respective speakers 12 and 14. Each of the panels 18, 22 is provided with a substantially rectangular aperture 24, 26, and each aperture has a central axis of elongation referred to as the major axis or height, and a central transverse axis referred to as the minor axis or width d of the aperture. Each of the speaker units 12, 14 is centered on its respective rectangular aperture 24 or 26, and is suitably adapted to transmit its sound output efficiently through its respective aperture 24, 26. Each speaker unit may have a conventional circular diaphragm or cone, schematically illustrated at 27, 29, with an outer diameter approximately equal to the height h of the rectangular aperture 24 or 26. Where a more efficient delivery of sound energy from a circular diaphragm or cone to the rectangular aperture 24, 26 is desired, the arrangement known as a "phase plug" may be used, as shown in my copending application Serial No. 834,311 for "Loudspeaker and Acoustic Transformer Therefor", filed Feb. 27, 1986 and assigned to the same assignee as the present application.

As shown in FIG. 1, the two baffles 18 and 22 are spaced apart by a distance of preferably 2*d* (although a larger spacing may be used) which is twice the width d of each of the baffle apertures 24, 26. Between the baffles 18 and 22 is a tapered wedge 30 having two faces 32, 34, each at a 45 degree angle to one of the two baffles 18 and 22. The sloping face 32 of the wedge 30 extends from about opposite one edge of the aperture 24 at a 45 degree angle thereto to a peak at the apex axis 36, which is approximately opposite the other edge of the aperture 24. Similarly, the face 34 of wedge 30 extends diagonally across the opposite aperture 26 in the same manner, as illustrated.

The wedge 30 is placed between the two loudspeakers 12, 14 so that the faces 32, 34 of the wedge 30 are at a 45 degree angle with respect to the direction of sound radiation from each speaker. Accordingly, the wavefront emerging from each speaker will reflect from the corresponding face of the wedge and be turned 90 degrees and directed out of the manifold exit 16. Five rays of such a wavefront are labeled A to E. Since each of the rays leaving the loudspeaker aperture travels exactly the same distance as all other rays from that aperture in reaching the manifold exit 16, the phase relationship between the rays remains the same and the exiting wavefront is an exact mirror image of the starting wavefront. By having the two speakers identical, with in-phase outputs, the same applies to the sound from the other speaker, and the sound waves from the two speaker units 12 and 14 thus exit from the manifold at 16 in side-by-side relationship to provide a phase-coherent wavefront emerging from the rectangular manifold exit 16 of width 2*d* (or more) and height h. An important feature is that the path length travelled by each of the rays A, B, C, D and E from the aperture 24 or 26 to the manifold exit 16 is equal to the corresponding path length for all other sound rays, which provides a phase coherency for the sound emerging from the manifold exit 16. Hence, power output is twice that of a single speaker, with no degradation of frequency response due to destructive interference resulting from the use of multiple speakers.

The sound exiting through manifold aperture 16 may be radiated directly into the surrounding atmosphere. Where desired a sound wave guide or horn structure 38 may be provided to determine the directivity of the output sound as desired.

The slanted faces 32, 34 need not be part of or form a wedge as shown in FIG. 1, but may be independent surfaces having the desired angular relation to panels 18, 22. Alternatively, the panels 18, 22 may be spaced more widely from wedge 30 than is shown. In these instances the separation between panels 18, 22 will exceed 2*d*, which may not be desirable from a space-saving viewpoint, or from the viewpoint of an efficient input to a horn or sound wave guide.

Figure 4:
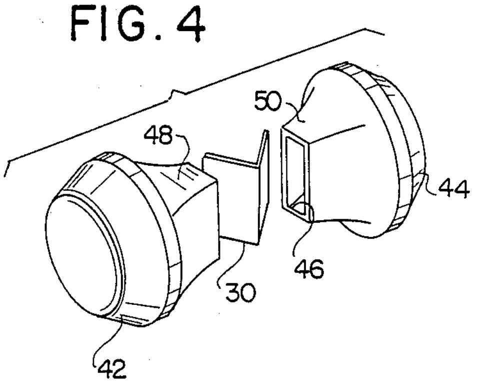
FIG. 4 is a slightly exploded perspective and schematic view of a portion of a modification of the system of FIG. 1 using compression drivers.

In place of simple loudspeakers 12 and 14, compression drivers 42, 44 may be used as shown diagrammatically in FIG. 4 where the enclosure 10 and baffle panels 18, 22 have been omitted for clarity of illustration, and the drivers 42, 44 and reflecting wedge 30 are shown in partly exploded view. Each driver has a transition section 48 or 50 for coupling its sound producing diaphragm or cone to a rectangular aperture, such as 46 on driver 44. This aperture 46 corresponds to aperture 24 of FIG. 1, and driver 44 may be mounted on a baffle panel such as 18 with rectangular driver aperture 46 in register with rectangular baffle aperture 24. The corresponding rectangular exit aperture of driver 42 is similarly mounted in register with baffle aperture 26 of FIG. 1, to form a speaker system like that of FIG. 1, but with enhanced efficiency afforded by the driver transition sections 48, 50. These transition sections may have the form of the vaned horn throat section described in U.S. patent application Serial No. 832,155 for "Constant Directivity Loudspeaker Horn" filed Feb. 21, 1986 in the name of David Gunness and assigned to the same assignee as the present application, or may be a similar unvaned throat serving as a sound entry to a rectangular sound exit opening.

Figure 3:
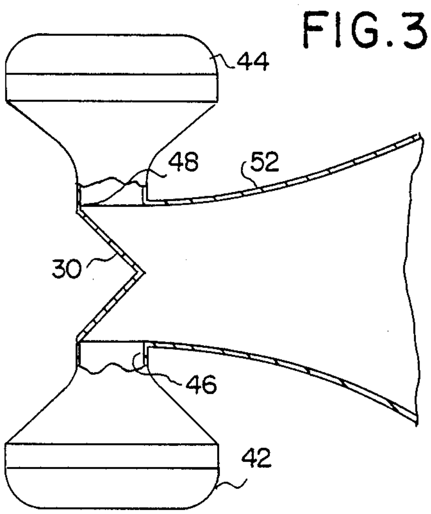
FIG. 3 is a plan schematic view partly in section of an arrangement for manifolding two compression driver speaker units into a wave guide or horn.

In some arrangements, the enclosure 10 may be dispensed with, and the outputs of drivers 42, 44 may be supplied directly to a sound wave guide or horn 52 as shown in FIG. 3. Horn 52 may be of any shape suitable for obtaining desired directivity characteristics for the output of the systems.

Figure 5A:
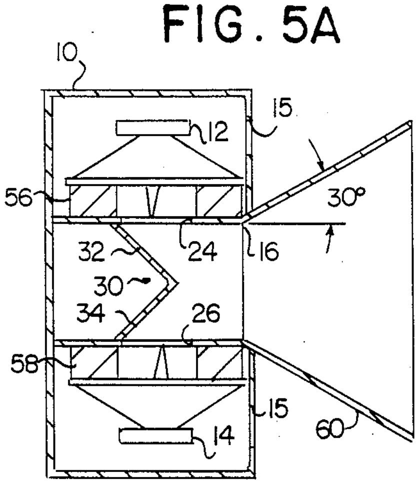
FIGS. 5A and 5B are respectively a plan view and an elevation view, each partly in section, of an arrangement similar to that of FIGS. 1, 2, 3 and 4, with a different form of speaker unit.
Figure 5B:
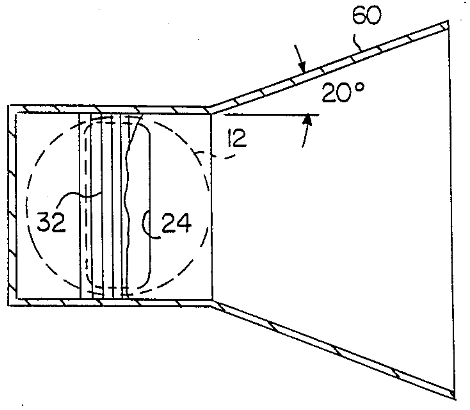

FIGS. 5A and 5B illustrate schematically an arrangement as in FIG. 1, for manifolding two speakers, where each speaker 12 or 14 is coupled to its respective aperture 24 or 26 by a respective phase plug, indicated schematically at 56 or 58. These phase plugs may have the configuration shown in my copending application Serial No. 834,311 for "Loudspeaker and Acoustic Transformer Therefor" filed Feb. 27, 1986 and assigned to the same assignee as the present invention. Such phase plugs modify the sound from speakers 12, 14 so as to be efficiently emitted from a rectangular aperture, as for inputting to a rectangular horn 60.

In one test two Electro-Voice DL10M loudspeakers were used as drivers and were provided with a phase-plug constructed to provide a coherent phase output into a 4" by 9" slot. Two such drivers were manifolded and loaded into a 60 degree by 40 degree wave guide horn as shown in FIGS. 5A and 5B. The frequency response was compared with a single driver feeding into the same 60 degree by 40 degree wave guide horn. The result showed that the frequency response of the manifolded units in the frequency range of interest (150–2,000 hertz) was essentially the same as with a single unit, establishing that the manifolding of this invention provides the desired addition in power output without degrading the frequency response.

Figure 6:
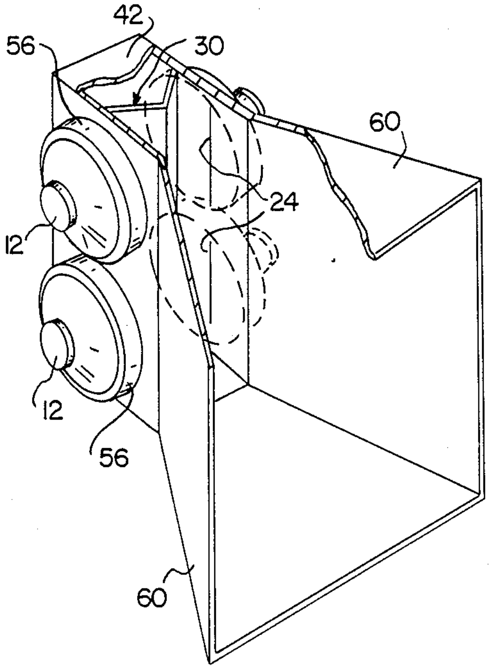
FIG. 6 is a diagrammatic perspective view of a modified system showing four speaker units manifolded into a horn or sound wave guide.

While the acoustic power output of two speakers or drivers has been effectively summed by means of the arrangements just described, in some instances further enhancement of acoustic power is desired. FIG. 6 shows schematically how outputs from four speakers or drivers can be combined in accordance with the invention, by placing one pair vertically above a second pair, each pair cooperating with either its own wedge as in FIG. 1 or with a common wedge illustrated in FIG. 6, in accordance with the principles described with respect to FIG. 1. It will be understood that additional pairs may be provided to form a larger system with greater power output.

Figure 7:
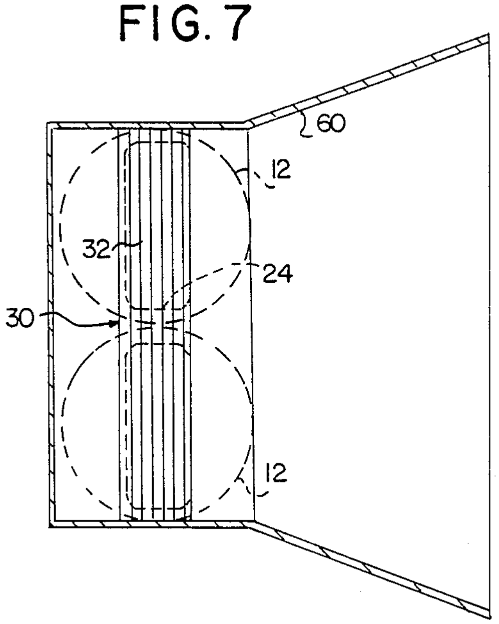
FIG. 7 is an elevation view partly in section of the system of FIG. 6.

FIG. 7 shows in a side elevation view, partly in section, how four speaker or driver units may be supplied to a wave guide horn. The plan view of such an arrangement is essentially the same as FIG. 5A.

Accordingly, the present invention shows how to manifold a plurality of loudspeakers or compression drivers to aggregate their acoustic power output, without any degradation in performance. The system provides a single aperture exit for the manifold, which therefore acts like a single driver instead of a plurality of drivers, substantially eliminating the effect of interference between the different drivers that is customarily caused by having multiple drivers facing frontward from a common baffle panel. The invention thus enables a plurality of units to be manifolded to drive a single horn, avoiding the necessity for a plurality of horns. In this way the determination of the directivity of the system is simplified to that defined by a single horn, which is readily determinable and designed in accordance with known principles.

What is claimed is:

1. A loudspeaker comprising:

means for defining a manifold chamber and having an exit opening communicating with the chamber and disposed within a first plane, said exit opening having an axis of elongation and a transverse axis normal thereto, said manifold chamber having a pair of rectangular apertures having particular areas communicating with the chamber, the first aperture of said pair being disposed in a second plane normal to the first plane and a second aperture of said pair being disposed in a third plane parallel to the second plane, the first and second apertures having axes of elongation parallel to the first plane and having transverse axes normal to the axis of elongation thereof of particular lengths, the first and second apertures confronting each other and being spaced from each other by a distance at least equal to the sum of the lengths of the transverse axes of the first and second apertures, a pair of speaker units exterior of the chamber, each of said speaker units having a sound emitting port, a first and a second means for acoustical coupling the first and second speaker units respectively, the first coupling means coupling the port of the first speaker unit to the first aperture and the second coupling means coupling the port of the second speaker unit to the second aperture, and reflecting means for reflecting sound energy disposed within the manifold chamber between said first and second apertures, said reflecting means having first and second sound reflecting faces disposed at an angle of 90 degrees with respect to each other, and an apex axis disposed between the faces, the apex axis being parallel to the axes of elongation of the first and second apertures, the first face of the reflecting means confronting the first aperture at an angle of 45 degrees with respect to the plane of said first aperture to direct sound waves from the first aperture toward the manifold chamber exit opening, and the second face of the reflecting means confronting the second aperture at an angle of 45 degrees with respect to the plane of said second aperture to direct sound waves from the second aperture toward the manifold chamber exit opening, said exit opening having an area at least as great as the sum of the areas of said first and second apertures, whereby the reflected sound waves are merged in side-by-side relation at the exit opening.

2. A loudspeaker as in claim 1 wherein said merged waves are radiated from said exit opening into surrounding space.

3. A loudspeaker as in claim 1 including a horn mounted on the means defining a manifold chamber having an entry at said exit opening.

4. A loudspeaker as in claim 1 wherein the manifold chamber has a third rectangular aperture with an axis of elongation coaxial with the axis of elongation of the first aperture, and a fourth rectangular aperture with an axis of elongation coaxial with the axis of elongation of the second aperture, the third and the fourth apertures confronting each other, a second pair of speaker units disposed exterior of said manifold chamber means, one of the speaker units of the second pair being acoustically coupled to the third aperture and the other speaker unit of the second pair being acoustically coupled to the fourth aperture, the first face of the reflecting means being disposed in the path of sound waves from the third aperture, and the second sound reflecting face of the reflecting means being disposed in the path of sound waves from the fourth aperture.

5. A loudspeaker as in claim 1, including a wave guide horn mounted adjacent to and communicating with said manifold chamber exit opening having a rectangular horn throat with an axis of elongation parallel to the apex axis of the reflecting means. said throat having a transverse axis normal to the axis of elongation of a particular length, the length of the transverse axis being at least equal to sum of the transverse axes of the first and second apertures.

6. A loudspeaker as in claim 1, wherein each of said loudspeaker units comprises an enclosure having an interior and exterior and having an opening and a port communicating from the interior to the exterior of the enclosure, and a loudspeaker with a reciprocatable diaphragm mounted on the enclosure with the diaphragm confronting the opening.

7. A loudspeaker of claim 1 wherein the speaker units comprise cone-type loudspeakers.

8. A loudspeaker of claim 1 wherein the speaker units comprise cone-type loudspeakers with phase plugs.

9. A loudspeaker of claim 1 wherein the speaker units comprise compression type drivers.

* * * * *